US009132733B2

(12) United States Patent
Tago et al.

(10) Patent No.: US 9,132,733 B2
(45) Date of Patent: Sep. 15, 2015

(54) INSULATION FAILURE DIAGNOSIS APPARATUS AND METHOD OF DIAGNOSING INSULATION FAILURE

(75) Inventors: Masakazu Tago, Aisai (JP); Atsuyuki Hiruma, Kariya (JP); Hiroyasu Kudo, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 705 days.

(21) Appl. No.: 13/554,371

(22) Filed: Jul. 20, 2012

(65) Prior Publication Data

US 2013/0021038 A1 Jan. 24, 2013

(30) Foreign Application Priority Data

Jul. 21, 2011 (JP) ................................ 2011-159960
Feb. 15, 2012 (JP) ................................ 2012-030391

(51) Int. Cl.
*G01R 31/08* (2006.01)
*G01R 31/02* (2006.01)
*B60L 3/00* (2006.01)

(52) U.S. Cl.
CPC ............. *B60L 3/0069* (2013.01); *G01R 31/025* (2013.01)

(58) Field of Classification Search
CPC ............................ B06L 3/0069; G01R 31/025
USPC .......... 324/510, 512, 521, 522, 529, 536, 544
See application file for complete search history.

(56) References Cited

U.S. PATENT DOCUMENTS

2009/0134881 A1* 5/2009 Tachizaki ...................... 324/551

FOREIGN PATENT DOCUMENTS

JP 2933490 8/1999
JP P4027727 10/2007

* cited by examiner

*Primary Examiner* — Jermele M Hollington
*Assistant Examiner* — Farhana Hoque
(74) *Attorney, Agent, or Firm* — Nixon & Vanderhye PC

(57) ABSTRACT

An insulation failure diagnosis apparatus is provided which diagnoses presence/absence of insulation failure between a body of a vehicle and a connection path to a power supply for a traction unit. The apparatus includes a power converter circuit connected to the power supply and supplying power to an in-vehicle auxiliary unit, an outputting unit outputting an AC signal to the connection path, and a diagnosis unit diagnosing presence/absence of the insulation failure based on a current flowing through the connection path when the AC signal is outputted. The diagnosis unit includes a storage unit storing a determination value for determining the insulation failure or information for setting the determination value. The determination value or the information is obtained by measuring an electrical state quantity of the connection path depending on stray capacitance and is dielectric resistance of the connection path obtained when an AC signal is outputted to the connection path.

20 Claims, 9 Drawing Sheets

16 MG INV1 CA 12 Lp PSC Lp1 INV2 10 18 20 22 M blower Lo 14 Ln 18 Ln1 44 34 40 ds OUTPUT UNIT 42 30 INV3 24 M Diag 46 P(water) Lo NONVOLATILE MEMORY 48 INV4 26 33 32 M DISPLAY UNIT ECU MC Lo P(oil)

16
MG
INV1
CA
22
M
blower
24
M
P(water)
26
M
P(oil)
Lo
INV2
INV3
INV4
Lp1
Ln1
34
MC
PSC
44
46
Diag
48
NONVOLATILE MEMORY
ds
42
20
18
40
OUTPUT UNIT
32
30
ECU
Lp
Ln
12
14
10
33
DISPLAY UNIT

MEASUREMENT
(BEFORE SHIPMENT OR WHEN CHANGING)

STORAGE

16
MG
CA
22
M
blower
24
M
P(water)
26
M
P(oil)
INV1
INV2
INV3
INV4
Lo
60
62
Lp1
Ln1
PSC
MC
34
46
Diag
48
NONVOLATILE MEMORY
32
44
ds
42
20
18
40
OUTPUT UNIT
30
ECU
Lp
Ln
12
14
10
33
DISPLAY UNIT

INSULATION FAILURE DIAGNOSIS APPARATUS AND METHOD OF DIAGNOSING INSULATION FAILURE

CROSS-REFERENCE TO RELATED APPLICATION

This application is based on and claims the benefit of priority from earlier Japanese Patent Applications No 2011-159960 filed Jul. 21, 2011 and No. 2012-30391 filed Feb. 15, 2012, the descriptions of which are incorporated herein by reference.

BACKGROUND

1. Technical Field

The present invention relates to an insulation failure diagnosis apparatus and a method of diagnosing insulation failure which diagnose presence or absence of insulation failure between a body of a vehicle and a connection path to a power supply for a traction unit installed in the vehicle.

2. Related Art

This type of insulation failure diagnosis apparatus is disclosed in, for example, Japanese Patent No. 4027727. When using this apparatus, the body of a vehicle is connected to one terminal of a power supply of a motor used as a traction unit via a capacitor and a resistor. The apparatus diagnoses presence or absence of insulation failure between the motor and the ground on the basis of a current passing through the capacitor when generating an AC voltage signal using an inverter connected to the motor.

Recently, some inverters for in-vehicle auxiliary units have been directly connected to a power supply for a traction unit. However, if the number of members connected to the power supply increases, stray capacitance between the power supply and the body of the so vehicle increases, or the value of dielectric resistance decreases. Hence, it is a concern that impedance associated with the stray capacitance or dielectric resistance is lowered. In this case, the accuracy of diagnosing the insulation failure can be lowered.

SUMMARY

An embodiment provides an insulation failure diagnosis apparatus and a method of diagnosing insulation failure, which diagnose presence or absence of insulation failure between a body of a vehicle and a connection path to a power supply for a traction unit installed in the vehicle with high accuracy.

As an aspect of the embodiment, an insulation failure diagnosis apparatus is provided which diagnoses presence or absence of insulation failure between a body of a vehicle and a connection path to a power supply for a traction unit installed in the vehicle. The apparatus includes: at least one power converter circuit which is connected to the power supply and supplies power to at least one in-vehicle auxiliary unit; an outputting unit which outputs a diagnosis AC signal to the connection path; and a diagnosis unit which diagnoses presence or absence of the insulation failure on the basis of a current flowing through the connection path when the diagnosis AC signal is outputted. The diagnosis unit includes a storage unit which stores a determination value for determining the insulation failure or information for setting the determination value. The determination value or the information is obtained by measuring an electrical state quantity of the connection path which depends on stray capacitance and dielectric resistance of the connection path obtained when an AC signal is outputted to the connection path when the power converter circuit is connected to the power supply.

DETAILED DESCRIPTION OF THE PREFERRED EMBODIMENTS

First Embodiment

With reference to the accompanying drawings, hereinafter is described a first embodiment in which an insulation failure diagnosis apparatus of the present invention is applied to a hybrid vehicle.

Figure 1:
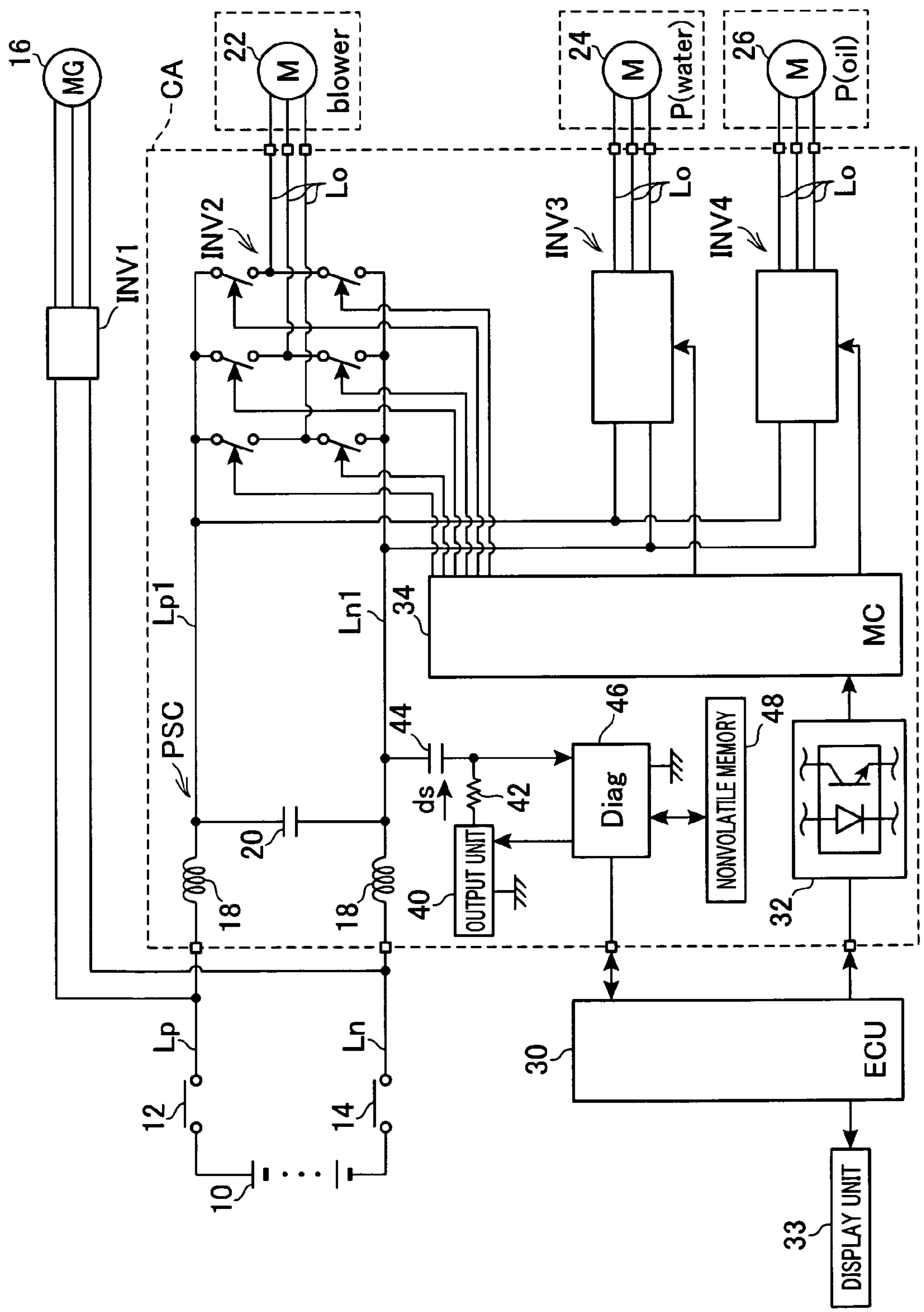
FIG. 1 is a diagram showing a configuration of a system according to a first embodiment.

FIG. 1 shows a configuration of a system according to the embodiment.

A high-voltage battery 10 is a secondary battery whose terminal voltage is, for example, 100 V or more. The high-voltage battery 10 is insulated from the body of the vehicle. Specifically, for example, a pair of capacitors is connected to the both ends of the high-voltage battery 10, and the connection points are connected to the body of the vehicle. Thereby, the middle value between the potential of the positive electrode and the potential of the negative electrode of the high-voltage battery 10 is set so as to be equal to the potential of the body of the vehicle.

The high-voltage battery 10 is connected to a pair of power-supply lines Lp, Ln. The power-supply lines Lp, Ln are opened and closed by a pair of relays 12, 14. An inverter INV1 is connected to the power-supply lines Lp, Ln. The inverter INV1 applies three-phase AC voltage to a motor generator 16 used as an in-vehicle traction unit.

In addition, a power supply circuit PSC is connected to the power-supply lines Lp, Ln. The power supply circuit PSC includes normal mode choke coils 18 and a smoothing capacitor 20 connected to the power-supply lines Lp, Ln.

Inverters INV2 to INV4 are connected to the power supply circuit PSC in parallel via power-supply lines Lp1, Ln1. The inverter INV2 applies three-phase AC voltage to a motor 22 for a blower fan installed in an in-vehicle air conditioner. The inverter INV3 applies three-phase AC voltage to a motor 24 installed in an oil pump for is circulating lubricating oil supplied to driving systems such as differential gears. In addition, the inverter INV4 applies three-phase AC voltage to a motor 26 installed in a water pump for cooling cooling water in cylinder blocks of an in-vehicle internal-combustion engine.

Switching elements configuring the inverters INV2, INV3 and INV4 are operated by a microcomputer (microcomputer 34). Specifically, the microcomputer 34 receives a command signal outputted from an electronic control unit (ECU 30) in an in-vehicle low-voltage system via a photocoupler 32 and operates the inverters INV2, INV3 and INV4 on the basis of the command signal.

The ECU 30 generates the command signal in response to a request from a user, a request for the control of an in-vehicle traction unit or the like. Note that the ECU 30 has a function for outputting a signal to a display unit 33 which indicates visual information to the outside (users).

The inverters INV2, INV3, INV4, and the microcomputer 34 are housed in one case CA. The in-vehicle auxiliary units (motors 22, 24, 26) respectively connected to the inverters INV2, INV3, INV4 are disposed outside the case CA. This aims to miniaturize the case CA and separate the places where the case CA and the auxiliary unit are disposed from each other, thereby disposing the case CA at a place where the case CA is unlikely to receive damage even when the vehicle has a collision.

Next, a method of diagnosing insulation failure of the present embodiment is described.

In the present embodiment, a function is provided for diagnosing presence or absence of insulation failure (whether or not insulation failure is caused) between the body of the vehicle and electrical paths between the inverters INV2 to INV4 and the motors 22, 24, 26 connected to the inverters INV2 to INV4. Specifically, a series connection of a capacitor 44 and a resistor 42 is connected to the power-supply line Ln1, and an output unit 40 is connected to the resistor 42. The output unit 40 is a means for outputting an AC voltage signal (diagnostic signal ds). When the ECU 30 outputs a command for outputting a diagnostic signal ds to a diagnosis unit 46, and the diagnosis unit 46 notifies the reception of the diagnostic signal ds to the output unit 40, the output unit 40 outputs the diagnostic signal ds. The diagnosis unit 46 diagnoses presence or absence of insulation failure on the basis of a potential of the connection point between the resistor 42 and the capacitor 44 when the diagnostic signal ds is outputted.

Figure 2:
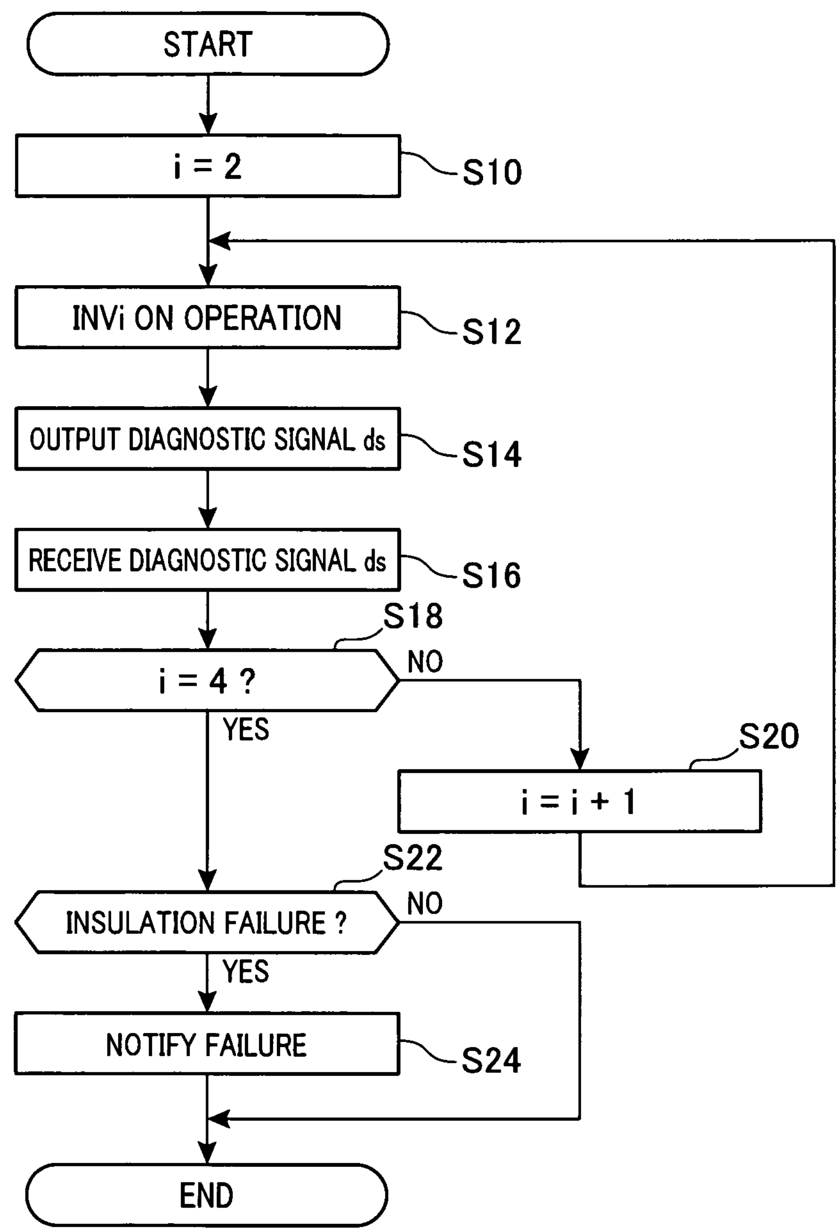
FIG. 2 is a flowchart showing a procedure of a diagnosis process according to the first embodiment.

FIG. 2 shows a procedure of the diagnosis process according to the present embodiment. This process is repeatedly performed, for example, at predetermined intervals with the cooperation of the ECU 30, the diagnosis unit 46, the output unit 40, and the microcomputer 34.

In this process, in step S10 first, a variable i specifying the inverters INV2 to INV4 is set to “2”, Next, in step S12, only in the inverter INVi, switching elements of the lower arm are turned on. This setting is performed so that only the output terminals of the inverter INVi can transmit the diagnostic signal ds received through the power-supply line Ln1. Next, in step S14, the diagnostic signal ds is outputted. In step S16, the potential difference between the capacitor 44 and the resistor 42 is detected (the diagnostic signal ds is received).

When the diagnostic signal ds is outputted, and if insulation failure is caused on, for example, an electrical path (output line Lo) between the inverter INVi and the corresponding auxiliary unit, the diagnostic signal ds is transmitted through a loop path including the resistor 42, the capacitor 44, the power-supply line Ln1, the lower arm of the inverter INVi, an electrical path between the inverter INVi and the corresponding auxiliary unit, and a dielectric resistance between the electrical path and the ground. In contrast, if there is no insulation failure, the diagnostic signal ds is outputted through the capacitor 44. However, since the impedance of the loop path is large, the diagnostic signal ds transmitted through the path can be ignored. Hence, presence or absence of insulation failure can be diagnosed on the basis of the difference in the transmission of the diagnostic signal ds in the loop path (the difference in the current flowing through the capacitor 44). Specifically, in the present embodiment, presence or absence of insulation failure is diagnosed on the basis of the difference in the amount of variation of potential difference between the capacitor 44 and the resistor 42.

Note that the abnornnity diagnosis process is performed for all the electrical paths between the inverters INV2, INV3, INV4 and the motors 22, 24, 26 which respectively correspond to the inverters INV2, INV3, INV4. Hence, while changing the inverter whose lower arm is turned on (step S20) until the variable i becomes “4” in step S18, the processes for outputting and receiving the diagnostic signal ds are repeated.

If affirmative judgment is made in step S18, in step S22, it is determined whether or not at least one insulation failure is diagnosed as having occurred. If at least one insulation failure is diagnosed, in so step S24, the display unit 33 gives notice of the diagnosis.

In the above process, if stray capacitance and dielectric resistance between the body of the vehicle and the inverters INV2 to INV4 or the like are ignored, setting the value of resistance of the resistor 42 to a value approximately equal to the maximum value of the value of resistance when determining that insulation failure is caused at the dielectric resistance, which is a diagnosis object, is effective in increasing the accuracy in the diagnosis. This is because the difference in the amplitude value of the received diagnostic signal ds can be made larger between the case where the value of resistance of the resistor 42 is slightly larger than the value of resistance obtained when insulation failure is determined and the case where the value of resistance of the resistor 42 is slightly smaller than the value of resistance obtained when insulation failure is determined.

Meanwhile, when stray capacitance and dielectric resistance exist between the inverters INV2 to INV4 and the like and the body of the vehicle, the received diagnostic signal ds is affected not only by the dielectric resistance, which is a diagnosis object, but also by a circuit in which the dielectric resistance, which is a diagnosis object, and the stray capacitance and dielectric resistance existing between the inverters INV2 to INV4 and the like and the body of the vehicle are connected in parallel. Specifically, as the stray capacitance between the inverters INV2 to INV4 and the like and the body of the vehicle becomes larger, or as the value of the dielectric resistance therebetween becomes smaller, the received diagnostic signal ds indicates behavior exhibited when the value of the dielectric resistance, which is a diagnosis object, is lowered. Hence, when setting a determination value for diagnosing presence or absence of insulation failure without considering the stray capacitance and the dielectric resistance existing between the inverters INV2 to INV4 and the like and the body of the vehicle, it is required to set the determination value to increase the probability that the insulation failure is determined even in the normal condition.

Hence, in the present embodiment, a determination value is set considering the stray capacitance and the dielectric resistance between the inverters INV2 to INV4 and the like and the body of the vehicle in order to determine with high accuracy whether the dielectric resistance, which is a diagnosis object, is a normal value or a value signifying insulation failure, as described later.

Figure 3A:
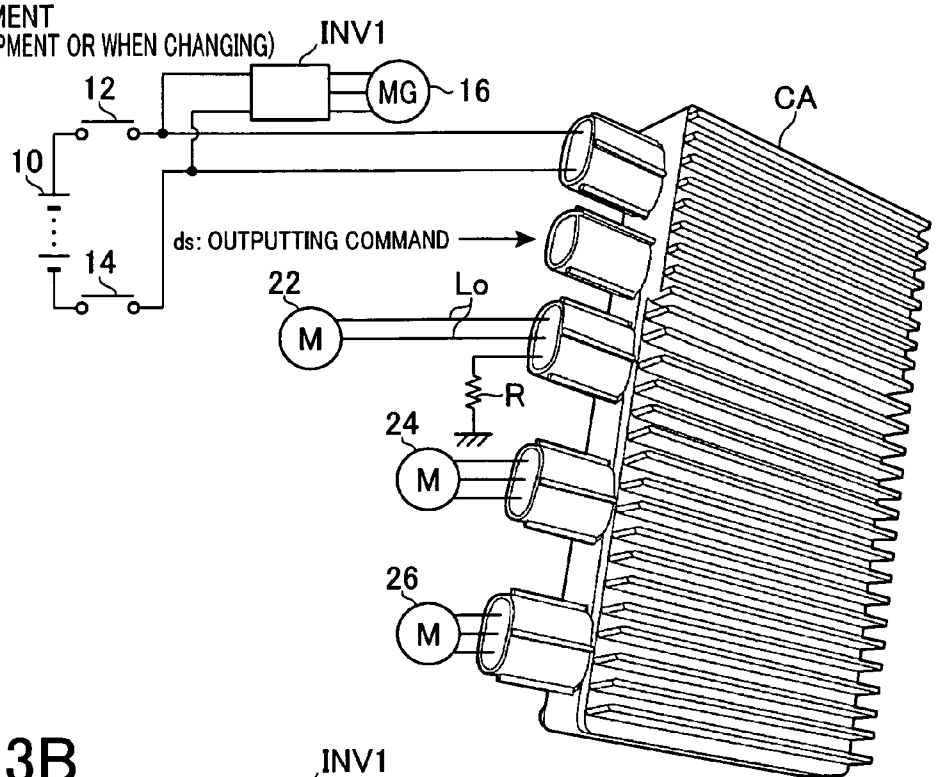
FIGS. 3A and 3B are diagrams showing a method of obtaining a determination value (information for generating a determination value) according to the first embodiment.
Figure 3B:
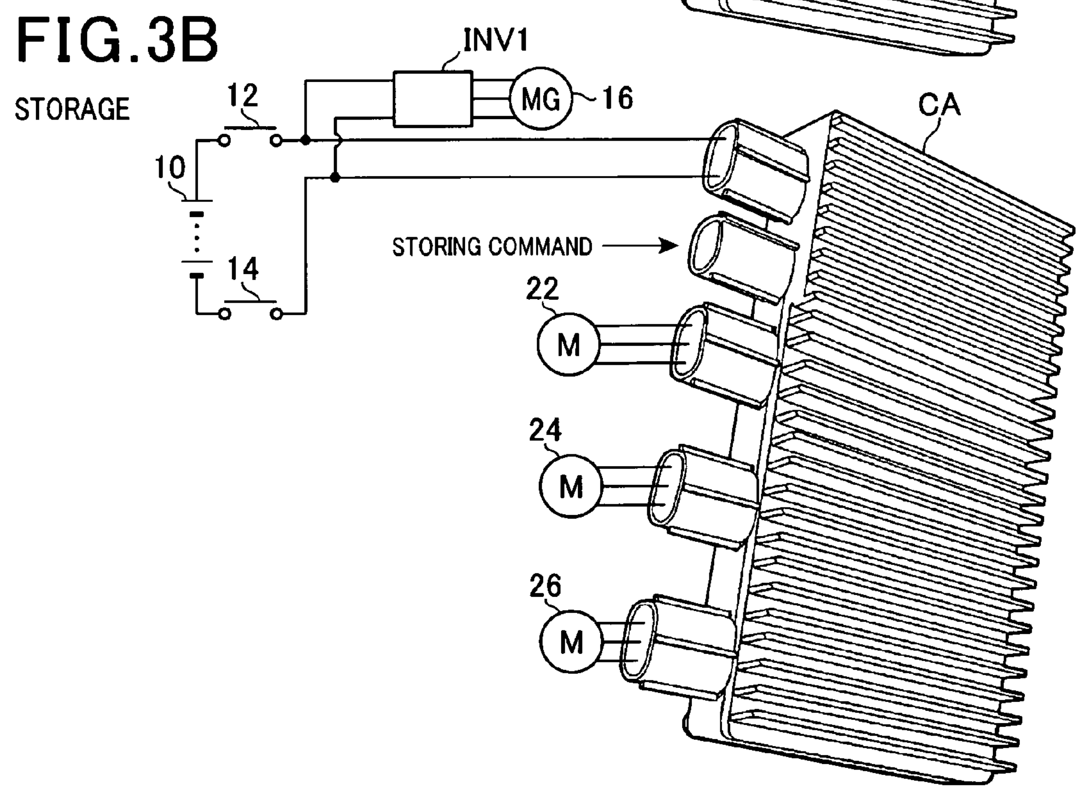

FIGS. 3A and 3B show part of a manufacturing process of the insulation failure diagnosis apparatus according to the present embodiment. As shown in FIG. 3A, in the present embodiment, a diagnostic signal ds is outputted via the capacitor 44 in a state where the inverters INV1 to INV4 are connected to the high-voltage battery 10. Then, the received diagnostic signal ds is measured. Specifically, prior to the measurement, the motors 22, 24, 26 are respectively connected to the inverters INV2, INV3, INV4 via a connector C of the case CA which accommodates the inverters INV2, INV3, INV4.

FIG. 3A illustrates a measurement process for generating information used for diagnosing presence or absence of insulation failure on an electrical path connected to the motor 22. That is, an appropriate output terminal of the inverter INV2 is connected to the body of the vehicle via a resistor R in a state where the connection between one terminal of the motor 22 and the inverter INV2 is broken. The value of resistance of the resistor R is the maximum value of the dielectric resistance between the body of the vehicle and the electrical path connecting between the terminal of the motor 22 and the inverter INV2 when an abnormality occurs. In the above state, the diagnosis unit 46 is instructed to output a command for outputting a diagnostic signal ds from the output unit 40 and to receive the diagnostic signal ds, via the connector C. Note that, in this state, in addition to the reception (measurement) of the diagnostic signal ds, all the output terminals of the inverter INV2 may be connected to the motor 22 to perform measurement for the case where the insulation against the body of the vehicle is sufficient.

The result of the measurement of the measurement process shown in FIG. 3A is stored in a nonvolatile memory 48 shown in FIG. 1 by inputting a storing command into the diagnosis unit 46 from the outside as shown in FIG. 3B. The nonvolatile memory 48 is a storage means which stores and holds data regardless of the presence or absence of power feeding, for example, an electrically erasable programmable read-only memory (EEPROM: registered trademark) or the like. Note that, the data stored in the nonvolatile memory 48 is not limited to the result of the measurement, and may be a determination value for insulation failure set depending on the result of the measurement.

As described above, the data stored when products are shipped can be updated by dealerships or the like by storing the result of the measurement or the determination value in the nonvolatile memory 48. Hence, for example, by changing part of the in-vehicle auxiliary unit or adding an in-vehicle auxiliary unit, the optimum determination value can be set for the stray capacitance and dielectric resistance under the condition that the stray capacitance and the dielectric resistance change.

According to the above described embodiment, the following advantages can be obtained.

(1) When, for example, products are shipped, the transmission state of the diagnostic signal ds is measured in a state where the inverters INV1 to INV4 are connected to the high-voltage battery 10. Then, the result of the measurement (information for setting a determination value) and a determination value set depending on the result of the measurement are stored in the nonvolatile memory 48. Hence, the presence or absence of insulation failure can be diagnosed with high accuracy.

(2) The measurement is performed in a state where the high-voltage battery 10 and the inverters INV1 to INV4 are installed in the vehicle. Hence, the measurement can be performed which reflects stray capacitance between the high-voltage system and the body of the vehicle and dielectric resistance of the high-voltage system with high accuracy.

(3) The measurement result and the determination value are stored in the nonvolatile memory 48. Hence, the data stored when products are shipped can be updated when changing the high-voltage system.

(4) When outputting the diagnostic signal ds via the capacitor 44, only lower arm switching elements in the inverter corresponding to the diagnosis object are turned on. Hence, the diagnosis object can be identified.

Second Embodiment

Hereinafter, a second embodiment is described focusing on the differences from the first embodiment with reference to the accompanying drawings.

Figure 4:
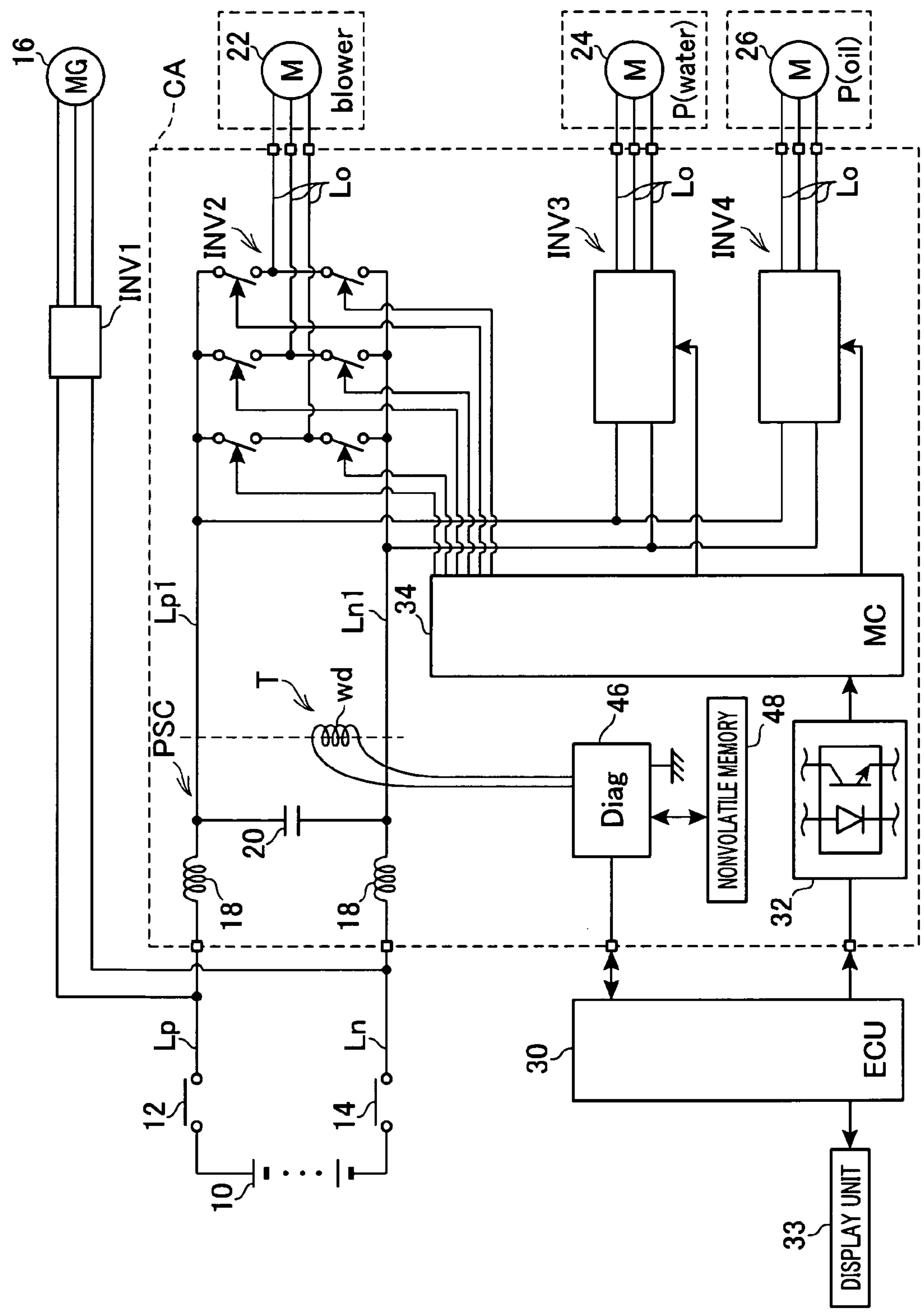
FIG. 4 is a diagram showing a configuration of a system according to a second embodiment.

FIG. 4 is a diagram showing a configuration of a system according to the present embodiment. Note that the same reference numerals as in FIG. 1 denote the same parts in FIG. 4.

Figure 5:
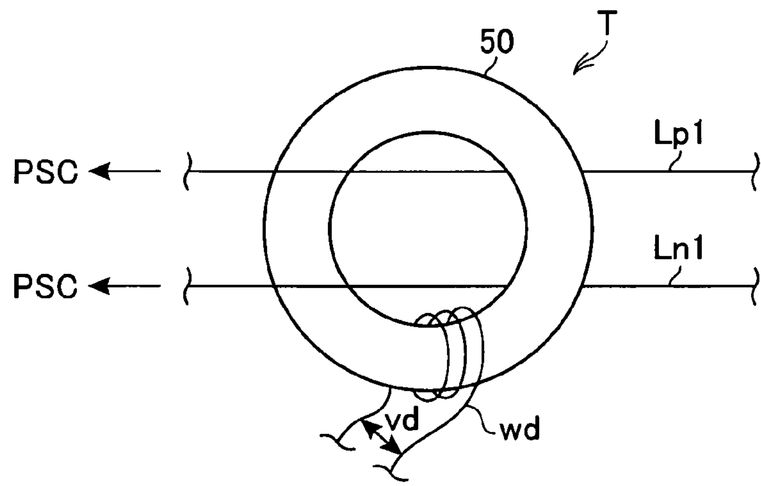
FIG. 5 is a diagram showing a configuration of a transformer according to the second embodiment.

As shown in FIG. 4, in the present embodiment, the capacitor 44 and the resistor 42 are not included. By alternately turning on the upper arms and the lower arms of the inverters INV2 to INV4 (complementary operation), an AC signal is outputted to electrical paths between the inverters INV2 to INV4 and the motors 22, 24, 26. In this case, presence or absence of insulation failure is diagnosed on the basis of the voltage induced by a detection coil wd. The detection coil wd is a secondary side coil of a transformer T and is magnetically coupled to both the power-supply lines Lp1, Ln1 which are the primary side. FIG. 5 shows the configuration of the transformer T.

As shown in FIG. 5, a core 50 (a toroidal core is illustrated) interlinks both the power-supply lines Lp1, Ln1 with the detection coil wd. In addition, the direction of the magnetic flux induced by the core 50 when a current flows from the power supply circuit PSC side to the inverter side through the power-supply line Lp1 and the direction of the magnetic flux induced by the core 50 when a current flows from the power supply circuit PSC side to the inverter side through the power-supply line Ln1 agree with each other.

In the above configuration, when an AC signal is outputted from the inverters INV1 to INV3, if the electrical paths between the inverters INV1, INV2, INV3 and the respectively corresponding motors 22, 24, 26 are insulated normally, it can be considered that absolute values of currents flowing through the power-supply line Lp1 and the power-supply line Ln1 are the same. In this case, the magnetic flux in the core 50 becomes zero from Ampere's rule. In contrast, if the electrical paths are not insulated normally, the absolute values of currents flowing through the power-supply line Lp1 and the power-supply line Ln1 are different from each other due to the current flowing to the body of the vehicle, thereby generating a magnetic flux in the core 50. Specifically, when generating an AC signal, since the difference between the absolute values of currents flowing through the power-supply line Lp1 and the power-supply line Ln1, varies, the magnetic flux in the core 50 also varies. Hence, the voltage which depends on the variation of the magnetic flux is induced in the detection coil wd. Therefore, by detecting the voltage, presence or absence of insulation failure can be diagnosed.

Figure 6:
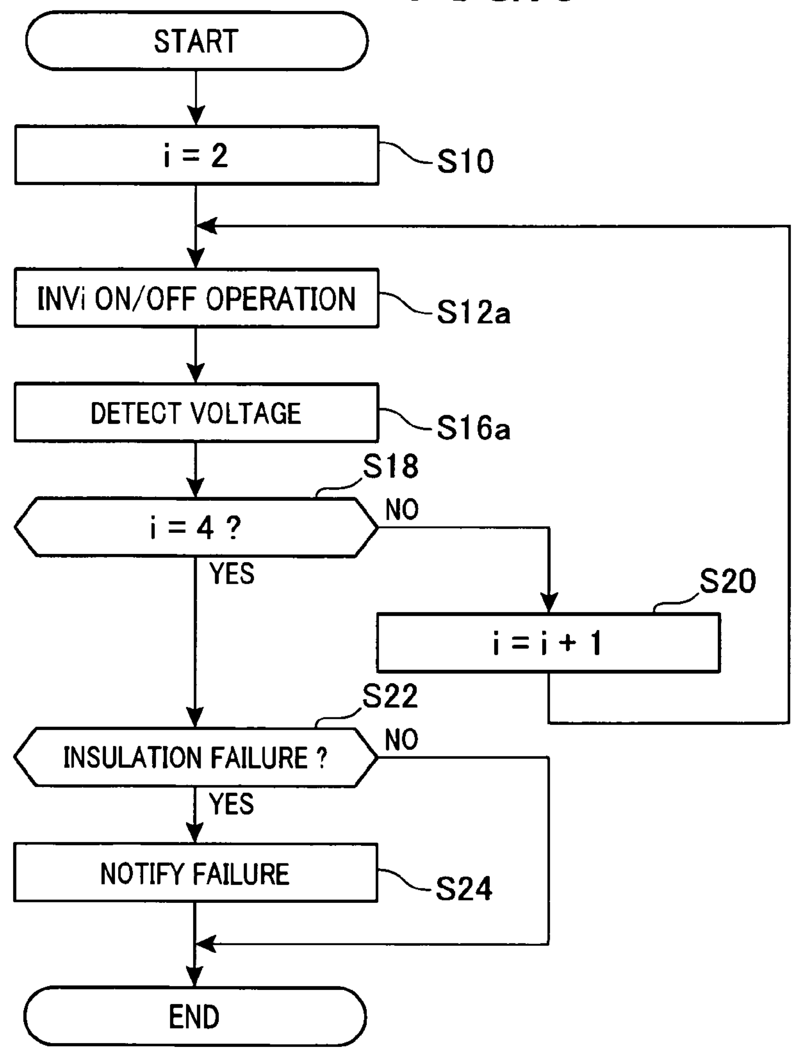
FIG. 6 is a flowchart showing a procedure of a diagnosis process according to the second embodiment.

FIG. 6 shows a procedure of an insulation failure diagnosis process according to the present embodiment. This process is repeatedly performed, for example, at predetermined intervals by the cooperation of the ECU 30, the diagnosis unit 46, the output unit 40, and the microcomputer 34. Note that the step numbers in FIG. 2 denote the same steps in FIG. 6.

In this process, in step S12*a*, switching elements of the upper arm and switching elements of the lower arm of the inverter INVi specified by a variable I are alternately turned on and off. In successive step S16*a*, voltage vd induced by the detection coil wd is detected.

As described above, according to the present embodiment, presence or absence of insulation failure can be diagnosed without connecting between the high-voltage system and the body of the vehicle via the capacitor 44 and the resistor 42. Note that, in this case, high-accuracy diagnosis is difficult unless the relationship is exactly obtained between the value of the dielectric resistance, which is a diagnosis object, and the voltage induced by the detection coil wd. If high-accuracy diagnosis cannot be performed, a high margin is required. Hence, it is especially important that a determination value is set by the manner of the first embodiment to perform diagnosis with high accuracy.

Third Embodiment

Hereinafter, a third embodiment is described focusing on the differences from the first embodiment with reference to the accompanying drawings.

In the present embodiment, presence or absence of insulation failure is diagnosed not in a binary manner but in two steps in order to reduce the pressure applied to the user. That is, when determining the presence or absence of insulation failure in a binary manner, if the presence of insulation failure is determined, the user feels pressure to immediately go to the dealership. To solve this problem, by determining problems intermediate between insulation failure and a normal condition, the user can be gently prompted to go to the dealership when the user has time. Hence, the user can be prevented from feeling the heavy pressure.

Figure 7:
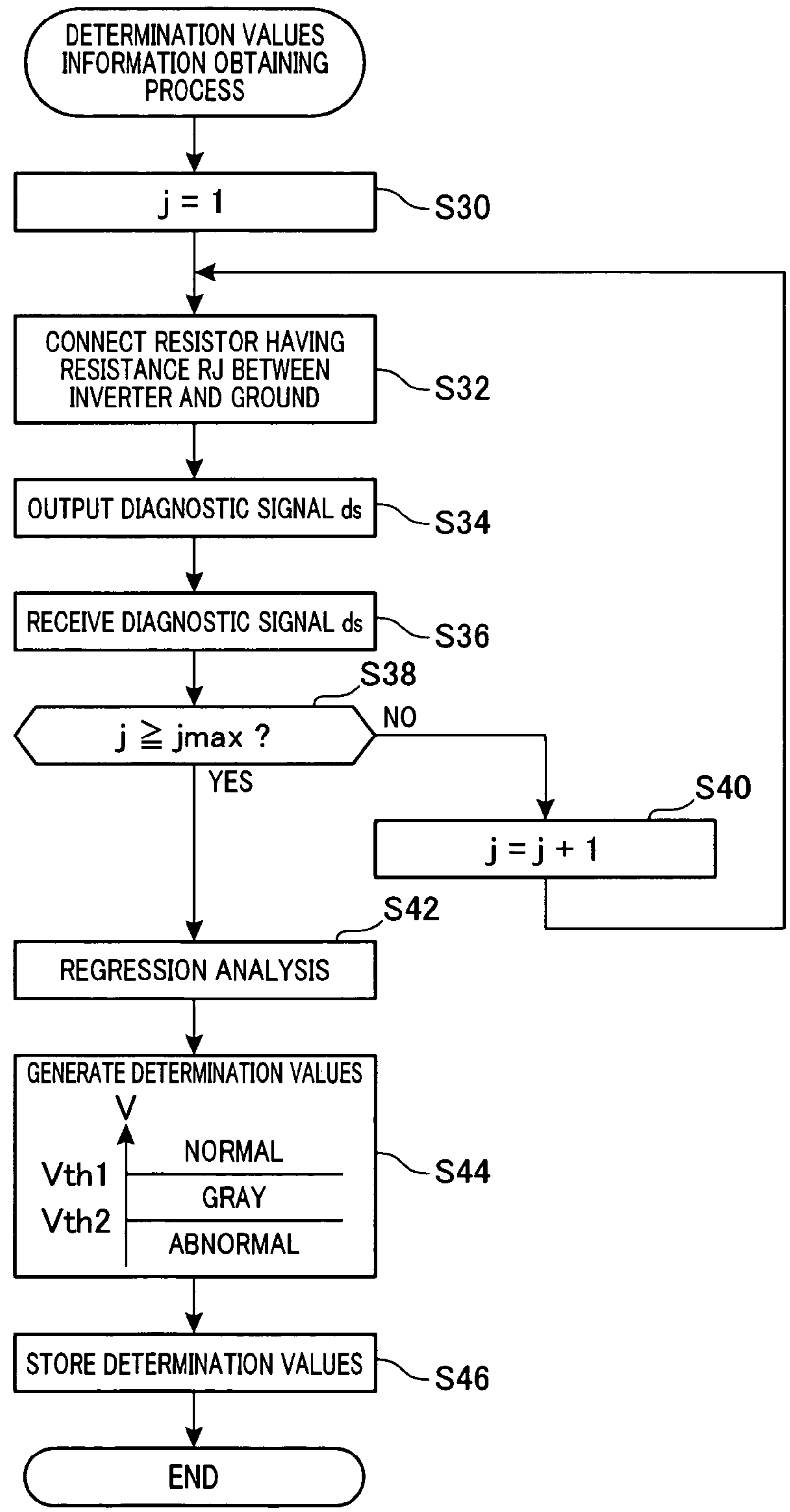
FIG. 7 is a flowchart showing a procedure of a diagnosis process according to a third embodiment.

FIG. 7 shows a process of generating determination values for insulation failure according to the present embodiment. This process corresponds to the process shown in FIG. 3, and, for example, is performed before products are shipped.

In this process, in step S30 first, a variable j specifying the value of resistance is set to "1". Next, in step S32, a resistor having the value of resistance Rj is connected between the body of the vehicle and the electrical path between any of the inverters INV2 to INV4 and any of the motors 22, 24, 26 corresponding thereto. Next, in step S34, a diagnostic signal ds is outputted. In step S36, the diagnostic signal ds is received. This process is performed until the variable j becomes the maximum value jmax (steps S38, S40).

If the diagnostic signals ds corresponding to respective values of resistance R1 to Rjmax, which are different from each other, are received, in step S42, regression analysis is performed. Specifically, a regression equation is generated, where the value of resistance is an explanatory variable, and the fluctuation range of the received diagnostic signal ds is a response variable. Next, in step S44, a determination value Vth2 and a determination value Vth1 are set on the basis of the regression equation. The determination value Vth2 is a value for diagnosing the fact that insulation failure is generated. The determination value Vth1 is a value which is one of a pair of values for defining an intermediate area (gray area) between an area where a normal condition is diagnosed and an area where insulation failure is diagnosed, Vth1 being different from the determination value Vth2. In step S46, the pair of the determination values Vth1 and Vth2 is stored in the nonvolatile memory 48.

Fourth Embodiment

Hereinafter, a fourth embodiment is described focusing on the differences from the first embodiment with reference to the accompanying drawings.

Figure 8:
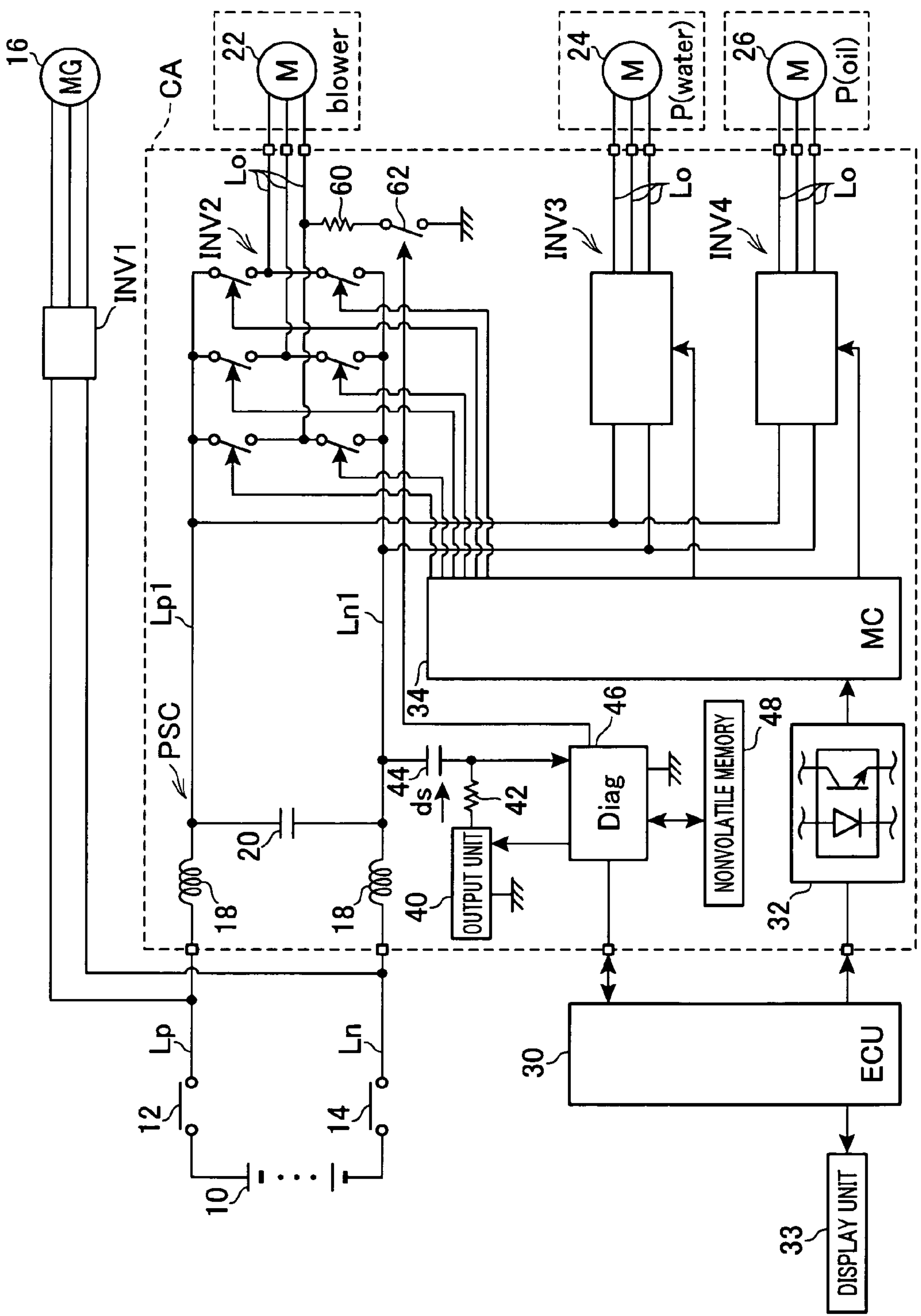
FIG. 8 is a diagram showing a configuration of a system according to a fourth embodiment.

FIG. 8 is a diagram showing a configuration of a system according to the present embodiment. Note that the same reference numerals as in FIG. 1 denote the same parts in FIG. 8.

As shown in FIG. 8, in the present embodiment, the body of the vehicle and the electrical path between the inverter INV2 and the motor 22 are connected via a series connection of a resistor 60 and a switching element 62. The resistor 60 is set to about the maximum value of the value of the dielectric resistance of the electrical path obtained when insulation failure of the electrical path is determined to be caused. Hence, when the diagnosis unit 46 turns on the switching element 62, a pseudo state where insulation failure is caused can be generated. Hence, in the measurement process shown in FIG. 3A, the measurement can be performed by externally instructing the diagnosis unit 46 to generate a pseudo state where insulation failure is caused and measure the transmission condition of the diagnostic signal ds.

Fifth Embodiment

Hereinafter, a fifth embodiment is described focusing on the differences from the second embodiment with reference to the accompanying drawings.

In the present embodiment, an auto-tuning apparatus for a parameter for diagnosing presence or absence of insulation failure is configured with the microcomputer 34, the diagnosis unit 46, and the nonvolatile memory 48.

Figure 9:
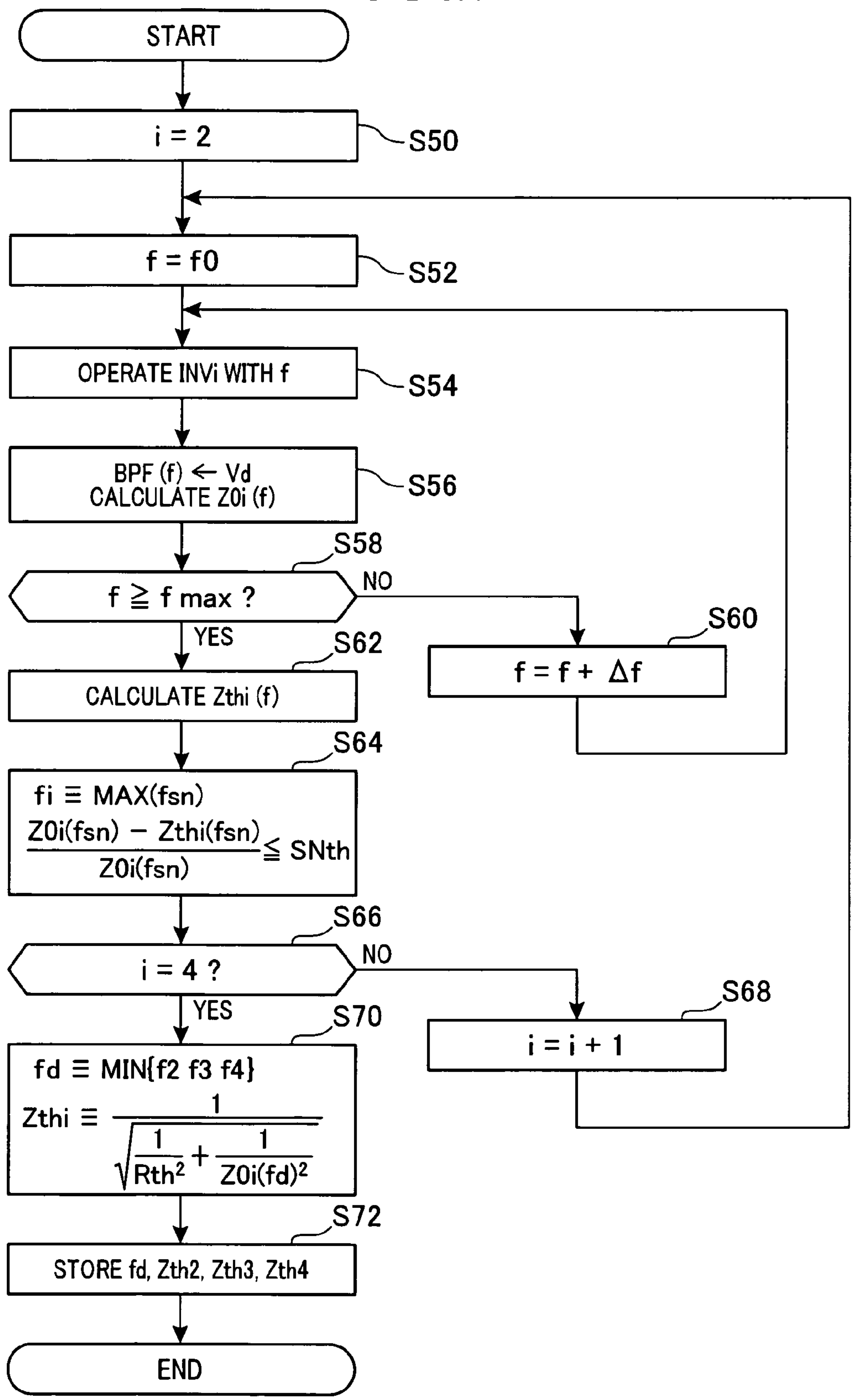
FIG. 9 is a flowchart showing a procedure of an auto-tuning process according to a fifth embodiment.

FIG. 9 shows a procedure of the auto-tuning process. This process is started with a trigger which is an instruction for performing auto-tuning issued from the outside via the ECU 30. The instruction is issued immediately after the inverters INV2 to INV4 are connected to the high-voltage battery 10 and an in-vehicle auxiliary unit is connected to each of the inverters INV2 to INV4.

In this process, in step S50 first, a variable i specifying the inverters INV2 to INV4 is set to "2". Next, in step S52, a frequency f of an adapted signal, which is for adapting an AC signal used for the diagnosis of insulation failure, is set to an initial frequency f0. Next, in step S54, by alternately turning on the upper arm and the lower arm of the inverter INVi, an AC signal is outputted to a corresponding one of the motors 22, 24, 26. In this process, the ratio between the period during which the upper arm is ON and the period during which the lower arm is ON is equalized, and the adapted signal is formed as a rectangular wave signal.

Next, in step S56, an initial impedance Z0*i* between the body of zo the vehicle and the corresponding one of the motors 22, 24, 26 or the output line Lo is calculated. First, a bandpass filter process is performed so as to transmit the component of frequency f of the voltage vd induced by the detection coil wd, and a root-mean-square value of a current (AC signal) flowing through the dielectric resistance is calculated on the basis of the frequency f component of the voltage vd. Next, a root-mean-square value of the frequency f component of a rectangular wave signal outputted from the inverter INVi is calculated, and initial impedance Z0*i* (f) is calculated on the basis of the ratio of the pair of root-mean-square values. Note that the bandpass filter process is a software process. This can be realized by outputting the voltage Vd detected by the diagnosis unit 46 to the microcomputer 34.

Figure 10:
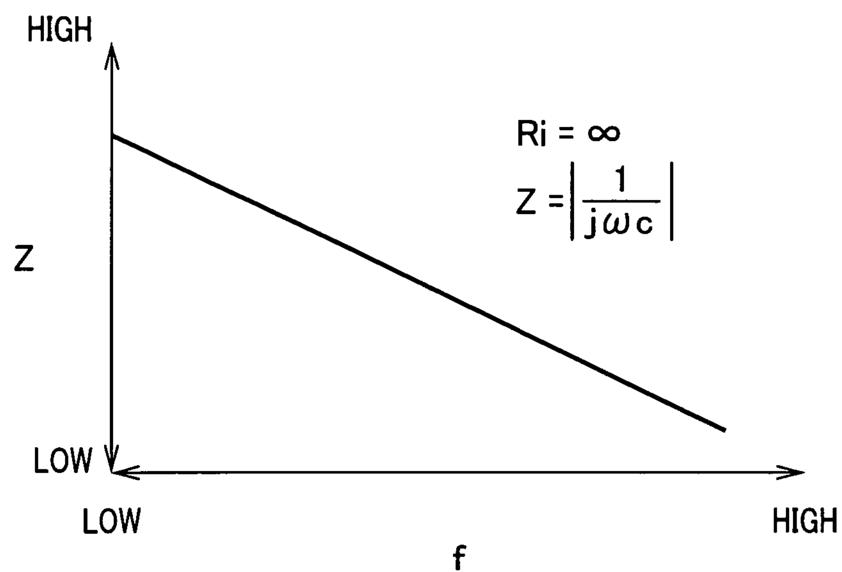
FIG. 10 is a diagram showing a relationship between initial impedance Z0*i* and frequencies.

Next, in step S58, it is determined whether or not the frequency f is equal to or more than the maximum frequency fmax. The maximum frequency fmax is the maximum frequency as a candidate of a frequency of the diagnostic signal ds. In step S58, if negative judgement is made, in step S60, the frequency f is corrected so as to be increased by the defined amount Δf, and the process returns to step S54. Hence, the initial impedance Z0*i* is calculated from the initial frequency f0 to the maximum frequency fmax. Note that the initial impedance Z0*i* tends to be lowered as the frequency f increases. This is because the impedance is determined due to, for example, stray capacitance between the body of the vehicle and the corresponding one of the motors 22, 24, 26 or the output line Lo. Specifically, if the dielectric resistance is very high, as shown in FIG. 10, in the double logarithmic chart of the frequency f and the impedance Z, the impedance Z linearly decreases as the frequency f increases.

In step S58, if an affirmative judgement is made, in step S62, the impedance is calculated as a determination candidate value Zthi (f) when the dielectric resistance decreased to the maximum value (lower limit value of resistance Rth) by which insulation failure is diagnosed, for the frequency f. This can be calculated from the following expression (c1) by using the corresponding initial impedance Z0.

$$Zthi(f) = \sqrt{\frac{1}{Rth^2} + \frac{1}{Z0i(f)^2}} \quad \text{(c1)}$$

Note that the expression (c1) is satisfied when assuming that the dielectric resistance is infinite at the time the initial impedance Z0*i* (f) is detected. In practice, by setting the lower limit value of resistance Rth to be infinite, the left-hand side of the expression (c1) agrees with the initial impedance Z0*i* (f).

Figure 11:
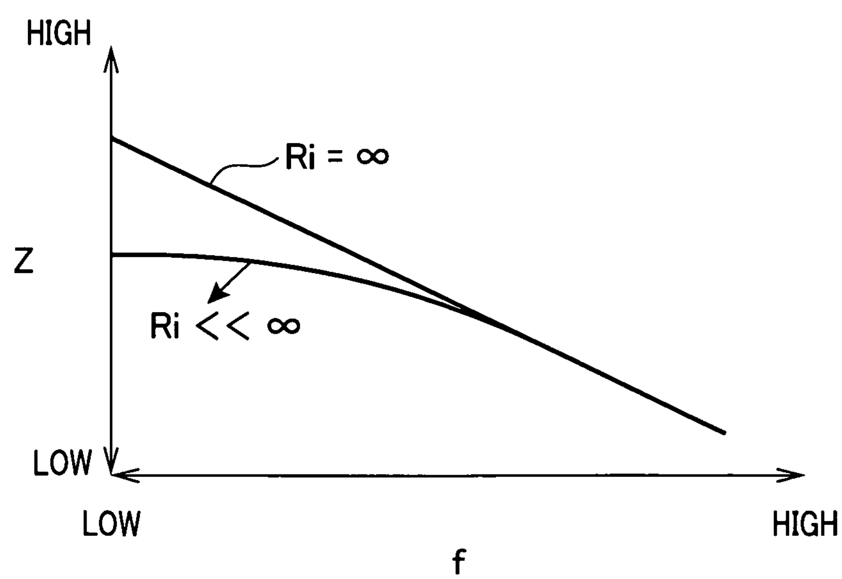
FIG. 11 is a diagram showing a relationship between impedance at the time dielectric resistance is lowered and frequencies.

Next, in step S64, a diagnosis frequency candidate value fi is calculated. Here, the diagnosis frequency candidate value fi is defined as the maximum frequency at which the amount of variation of the determination candidate value Zthi (f) with respect to the initial impedance Z0*i*(f) becomes equal to or larger than the defined amount (Z0*i*(f)×SNth). This aims to improve the S/N ratio. That is, as shown in FIG. 11, when the value of dielectric resistance Ri decreases, the impedance changes from the initial impedance Z0*i* (f). However, the amount of variation becomes small as the frequency f becomes high. Hence, by selecting the frequency f at which the amount of variation becomes large, the resistance of diagnosis against noise is increased.

Note that, to increase the resistance against noise due to the amount of variation, it is better that the frequency f is lower. However, using high frequency has an advantage that the transformer T can be miniaturized. That is, a means for increasing the absolute value of the voltage induced by the detection coil wd includes increasing the number of turns and increasing the rate of variation of the magnetic flux. If the number of turns increases, the transformer T becomes larger. Hence, to miniaturize the transformer T while increasing the voltage vd of the detection coil wd to some extent, increasing the frequency f as much as possible is desirable.

Next, in step S66, it is determined whether or not the variable i is "4". This process is performed for all the inverters INV2 to INV4 to determine whether or not the processes of steps S54 to S64 are completed. If negative judgement is made in step S66, in step S68, the variable i is incremented, then the process returns to step S52.

In contrast, if affirmative judgment is made in step S66, the process proceeds to step S70. In step S70, the frequency fd of the diagnostic signal ds is set to the minimum value between the so frequency candidate values f2 to f4 respectively calculated in step S64 for the inverters INV2 to INV4, This setting is performed for increasing as much as possible the amount of variation from the initial impedance Z0*i*, the variation being due to the decrease of the value of the dielectric resistance Ri.

In addition, determination values Zth2 to Zth4 respectively corresponding to the inverters INV2 to INV4 are defined in the expression (c1) as values obtained when the frequency f of the initial impedance Z0*i* (f) is the frequency fd of the diagnostic signal ds.

In step S72, the frequency fd and the determination values Zth2 to Zth4 are stored in the nonvolatile memory 48. Then, the process is temporarily stopped.

As described above, according to the present embodiment, in a state where the high-voltage battery 10 is connected to the inverters INV2 to INV4 and the like, the frequency fd and the determination values Zth2 to Zth4 can be subject to auto-tuning. Specifically, if auto-tuning is performed after the motors 22, 24, 26 and the like are accommodated in respective cases and are connected to the respective inverters INV2 to INV4, the frequency fd and the determination values Zth2 to Zth4 can be set to appropriate values depending on stray capacitance or the like which varies depending on the case.

Note that, in the above process, the frequency fd of the diagnostic signal ds is commonly used to simplify the diagnosis process and reduce the memory capacity of the nonvolatile memory 48.

It will be appreciated that the present invention is not limited to the configurations described above, but any and all modifications, variations or equivalents, which may occur to those who are skilled in the art, should be considered to fall within the scope of the present invention.

Another Embodiment

Regarding the Measurement Process:

The insulation failure diagnosis apparatus is not limited to the configuration which outputs a diagnosis AC signal by an AC signal outputting means (the output unit 40 or the inverters INV1 to INV3) installed in the vehicle. For example, an AC signal may be outputted by using a dedicated means which is not installed in the vehicle in practice to measure the electrical state quantity of a connection path to the high-voltage battery 10.

The insulation failure diagnosis apparatus is not limited to the configuration which performs measurement when the inverters INV2 to INV4 and the high-voltage battery 10 are installed in the vehicle. For example, in a state where power converter circuits for auxiliary units are finally accommodated in a case whose surface contacts the body of the vehicle, the measurement can be performed substantially in a state where the inverters INV2 to INV4 and the high-voltage battery 10 are installed in the body of the vehicle.

In addition, the insulation failure diagnosis apparatus is not limited to the configuration which performs measurement when all the power converter circuits for auxiliary units and the auxiliary units are connected. For example, if the measurement is performed in a state where at least 80 percent of the power converter circuits for auxiliary units and the auxiliary units are connected, it can be considered that the accuracy of determination values significantly differs from that obtained when none of the power converter circuits for auxiliary units and the auxiliary units are connected.

Note that the insulation failure diagnosis apparatus is not limited to the configuration which, when products are shipped, performs measurement for each vehicle to detect individual differences. For, example, determination values which depend on the result of the measurement for a vehicle prototype may be stored in all the vehicles. Even in this case, if part of components configuring the high-voltage system is changed, the electrical state quantity of each individual is measured, and then determination values are set on the basis of the measurement result, the accuracy of the diagnosis after the change can be improved. In addition, for example, if common determination values are set to all the vehicles, so the determination values may be used to diagnose insulation failure in multiple stages as in the case of the third embodiment. Then, when the user goes to the dealership because the equipment is diagnosed as being in a "gray area", a closer inspection may be performed. If insulation failure is not present, each electrical state quantity of the individual equipment may be measured to update the determination values.

Regarding Multistage Diagnosis of the Degree of Insulation Failure:

The insulation failure diagnosis apparatus is not limited to the configuration which performs diagnosis in three stages of "normal", "gray", and "insulation failure" as illustrated in the third embodiment. The insulation failure diagnosis apparatus may perform the diagnosis of the degree of insulation failure in four stages or continuously.

Regarding the Diagnosis Means (Unit):

The insulation failure diagnosis apparatus is not limited to the configuration of the first embodiment which outputs a diagnostic signal ds while turning on the switching elements of only the inverter corresponding to the diagnosis object to identify a portion of is insulation failure. For example, a diagnostic signal ds may be outputted in a state where the switching elements of all the inverters INV1 to INV3 are turned on. Even in this case, presence or absence of insulation failure between the high-voltage system and the body of the vehicle can be diagnosed.

In the second embodiment, the insulation failure diagnosis apparatus may have a configuration in which the high-voltage system and the body of the vehicle are connected by a series connection of the capacitor 44 and the resistor 42, and which diagnoses presence or absence of insulation failure on the basis of the amount of current flowing through the capacitor 44.

In the second embodiment, the insulation failure diagnosis apparatus may have a configuration in which a shunt resistance may be connected to each of the high-potential side power-supply line Lp1 and the low-potential side power-supply line Ln1, and which detects the difference of the amounts of current flowing through the shunt resistances on the basis of the amounts of voltage drops of the shunt resistances.

Regarding the Diagnosis Object:

The diagnosis object is not limited to a dielectric resistance of an electrical path between an in-vehicle auxiliary unit and a power converter circuit thereof. For example, the diagnosis object may be the power-supply lines Ln1 and Lp1 or the like shown in FIG. 1. This can be realized in the first embodiment by outputting a diagnostic signal ds in a state where the switching elements of all the inverters INV1 to INV4 are turned off. Note that, in this case, if a phase shift of the diagnostic signal ds caused by the normal mode choke coils 18 is not considered and it is determined that insulation failure is caused, dielectric resistance of an electrical path between the motor generator 16 for a traction unit and the inverter INV1 is included as the abnormal portion.

Regarding the Electrical State Quantity:

In the first embodiment, the electrical state quantity may be voltage across the resistor 42. In this case, the amount of a voltage drop of the resistor 42 serves as a parameter having a correlation with the amount of current flowing through the capacitor 44 when the diagnostic signal ds is outputted.

Regarding the Outputting Means (Unit):

In the first embodiment, the capacitor 44 may be connected to the high-potential side power-supply line Lp1. In addition, the insulation failure diagnosis apparatus is not limited to the configuration in which the capacitor 44 is connected to any one of the high-potential side power-supply line Lp1 and the low-potential side power-supply line Ln1. Capacitors may be connected to the high-potential side power-supply line Lp1 and the low-potential side power-supply line Ln1 individually. In this case, if all the inverters INV1 to INV4 are turned off, and phases and amplitudes of an AC signal outputted to the power-supply line Lp1 and an AC signal outputted to the power-supply line Ln1 are equalized, presence or absence of insulation failure of the power-supply lines Lp1 and Ln1 can be determined by using the detection coil wd as in the case of the second embodiment.

Regarding the Storage Means (Unit):

The storage means is not limited to the nonvolatile memory 48. For example, the storage means may be a volatile memory such as a backup RAM in which power is maintained even in a situation in which power supply to the diagnosis unit 46 and the microcomputer 34 is interrupted. Note that, although an EEPROM (electrically erasable programmable read-only memory) is desirable as the storage means, the storage means is not limited to the EEPROM. Even in a memory which is not electrically erasable programmable, a determination value on which individual differences are reflected when products are shipped and information for generating the determination value can be stored.

Regarding the Difference Signal Generating Means (Unit):

In the second embodiment, the insulation failure diagnosis apparatus may include a first core through which the power-supply line Lp1 penetrates and through which the power-supply line Ln1 does not penetrate, a second core through which the power-supply line Ln1 penetrates and through which the power-supply line Lp1 does not penetrate, and a detection coil through which both the first core and the second core penetrate. In addition, the directions of magnetic fluxes of the first core and the second core interlinking the detection coil may be opposite to each other.

Note that, as stated in the above "Regarding the diagnosis means", the insulation failure diagnosis apparatus is not limited to the configuration which includes the detection coil through which a magnetic flux generated by a current flowing through the power-supply line Lp1 and a magnetic flux generated by a current flowing through the power-supply line Ln1 penetrate.

Regarding the Simulating Means (Unit):

The impedance component is not limited to the single resistor 60. For example, the impedance component may be a series ao connection of a resistor and an inductor.

The impedance component is not limited to the series connection of a set of the resistor 60 and the switching element 62. The impedance component may include a plurality of resistors whose values of resistance are different from each other and switching elements connected to the resistors.

Regarding the adaptation outputting means (unit):

The adaptation outputting means may be the output unit 40 of the first embodiment (FIG. 1). If the lower arm of one of the inverters INV2 to INV4 is turned on, impedance between the point between the inverter and the in-vehicle auxiliary unit and the body of the vehicle can be detected. The adaptation outputting means is not limited to a means for selectively outputting an adapted signal to a portion of the in-vehicle auxiliary unit. That is, all the lower arms of the inverters INV2 to INV4 may be turned on to detect synthetic impedance between points between the inverters INV2 to INV4 and the corresponding in-vehicle auxiliary units and the body of the vehicle.

In addition, the adaptation outputting means is not limited to a means for outputting the diagnostic signal ds but may be an additional output means for AC signals dedicated to adaptation.

The AC signal is not limited to a rectangular wave signal but may be a sinusoidal signal. In this case, when detecting a current by the initial impedance detecting means, detection accuracy of the initial impedance can be increased when the bandpass filter process is not performed.

Regarding the Initial Impedance Detecting Means (Unit):

For example, if the adaptation outputting means is the output unit 40 of the first embodiment (FIG. 1), the initial impedance detecting means may include a means for detecting a current on the basis of a detection value of the amount of variation of the potential between the capacitor 44 and the resistor 42.

Note that, as stated in the above "Regarding adaptation outputting means", the initial impedance detecting means is not limited to a means for detecting impedance between a point between any one of the inverters INV2 to INV4 and the corresponding in-vehicle auxiliary unit and the body of the vehicle. In addition, as stated in the above "Regarding adaptation outputting means", the initial impedance detecting means is not limited to a means which performs the bandpass filter process when detecting a current.

Regarding the Determination Value Calculating Means (Unit):

The insulation failure diagnosis apparatus is not limited to the configuration of the fifth embodiment (FIG. 9) in which the value of dielectric resistance of the initial impedance Z0*i* is assumed to be infinite. For example, the value of dielectric resistance may be assumed to be a predetermined value which satisfies the insulation requirement. Even in this case, impedance due to stray capacitance can be calculated from the initial impedance Z0*i*, whereby the determination value Zthi can be calculated.

In addition, the insulation failure diagnosis apparatus is not limited to the configuration in which the initial value of dielectric resistance is appropriately assumed for calculating the determination value Zthi on the basis of the initial impedance Z0*i* and the lower limit value of resistance Rth of the dielectric resistance. For example, the frequency fd of the diagnostic signal ds may be determined in addition to settting the determination value Zth to the lower limit value of resistance Rth so that the initial impedance Z0*i* becomes more than the lower limit value of resistance Rth. Even in this case, since the insulation failure can be determined by detecting the decrease in dielectric resistance, the presence of insulation failure can be indicated before the dielectric resistance becomes less than the lower limit value of resistance Rth.

Regarding the Frequency Determining Means (Unit):

The insulation failure diagnosis apparatus is not limited to the configuration in which, on the condition that impedance Z varies more than a specified value with respect to the initial impedance Z0*i* when the dielectric resistance Ri decreases to the lower limit value of resistance Rth, the determination value Zthi is set. For example, considering that the voltage wd of the detection coil wd increases as the frequency fd of the diagnostic signal ds increases, the resistance against noise due to the voltage wd increases by increasing the frequency fd. Hence, considering both the decrease of the variation of the impedance Z with respect to the initial impedance Z0*i* due to the increase of the frequency fd and the increase of the amplitude of the voltage wd, the frequency fd may be set so as to maximize the resistance against noise. This can be realized by providing a map in which the relationship between the magnitude of the variations and evaluation values thereof is determined and a map in which the relationship between the frequency fd and evaluation values of the magnitude of the amplitude is determined, and by selecting the frequency at which the sum of the evaluation values calculated from the pair of maps becomes maximum.

In addition, as stated in the above "Regarding determination value calculating means", the insulation failure diagnosis apparatus is not limited to the configuration having a frequency at which the amount of variation of the impedance Z becomes equal to more than a specified value with respect to the initial impedance Z0*i* when dielectric resistance decreases to the lower limit value of resistance Rth.

Regarding the Indicating Means (Unit):

The indicating means is not limited to a means which performs indication using visual information, but may be a means which performs indication using a tone.

Regarding the Vehicle:

The vehicle is not limited to a hybrid vehicle, but may include only a means (secondary battery, fuel battery) outputting electric energy, as a storage means for energy supplied to the in-vehicle traction unit.

Hereinafter, aspects of the above-described embodiments will be summarized.

As an aspect of the embodiment, an insulation failure diagnosis apparatus is provided which diagnoses presence or absence of so insulation failure between a body of a vehicle and a connection path (LP, Ln, INV1 to INV 4, Lo, 22, 24, 26) to a power supply (10) for a traction unit installed in the vehicle. The apparatus includes: at least one power converter circuit (INV2 to INV 4) which is connected to the power supply and supplies power to at least one in-vehicle auxiliary unit (22, 24, 26); an outputting unit (40, INV2 to INV 4) which outputs a diagnosis AC signal (ds) to the connection path; and a diagnosis unit (46) which diagnoses presence or absence of the insulation failure on the basis of a current flowing through the connection path when the diagnosis AC signal is outputted. The diagnosis unit includes a storage unit (48) which stores a determination value for determining the insulation failure or information for setting the determination value. The determination value or the information is obtained by measuring an electrical state quantity of the connection path which depends on stray capacitance and dielectric resistance of the connection path obtained when an AC signal is outputted to the connection path when the power converter circuit is connected to the power supply.

The stray capacitance and dielectric resistance between the connection path and the body of the vehicle depend on the structure of the connection path. Hence, the stray capacitance and dielectric resistance in the state where the power converter circuit is connected to the power supply and those in the state where the power converter circuit is not connected to the power supply are different from each other. According to the apparatus, presence or absence of insulation failure can be diagnosed with high accuracy on the basis of the electrical state quantity having high accuracy obtained by measuring the electrical state quantity of the connection path in a state where the power converter circuit is connected to the power supply.

In the apparatus, the electrical state quantity is measured in a state where the power converter circuit and the power supply are installed in the vehicle.

The stray capacitance and dielectric resistance depend on the geometric relationship between the connection path and the body of the vehicle. Hence, in a state where the connection path is not arranged in the vehicle, it is difficult to obtain stray capacitance and dielectric resistance with high accuracy at the time when the power converter circuit is installed in the vehicle. Considering this point, in the apparatus, electrical state quantity of the connection path is measured in a state where the power converter circuit is connected to the power supply in the vehicle.

In the apparatus, the electrical state quantity is quantified on the basis of a current flowing through the connection path according to the outputted diagnosis AC signal.

When outputting the diagnosis AC signal to the connection path, an AC current flowing through the connection path depends on stray capacitance and dielectric resistance between the connection path and the body of the vehicle. Considering this point, in the apparatus, the electrical state quantity which depends on the stray capacitance and the dielectric resistance between the connection path and the body of the vehicle is quantified on the basis of the current.

In the apparatus, the storage unit stores and holds data even in a state where power for performing a process diagnosing presence or absence of the insulation failure is not supplied, and updates the data.

In the apparatus, since the data of the storage unit can be updated, the determination value and the information can be updated, for example, when the structure of the connection path is changed.

In the apparatus, the diagnosis unit determines an abnormal condition in which the insulation failure is caused, a normal condition in which the insulation failure is not caused, and an intermediate condition between the abnormal condition and the normal condition. The apparatus further includes an indicating unit (33) which indicates the intermediate condition.

When diagnosing presence or absence of the insulation failure in a binary manner, the user may easily feel pressure to immediately go to the dealership if the presence of the insulation failure is determined. However, in the apparatus, by indicating the intermediate condition between the abnormal condition and the normal condition, the user can go to the dealership when having time. Hence, the pressure felt by the user can be reduced.

In the apparatus, the at least one in-vehicle auxiliary unit includes a plurality of in-vehicle auxiliary units, and the at least one power converter circuit includes power converter circuits connected to the plurality of in-vehicle auxiliary units individually.

In the apparatus, since the connection path is configured with a plurality of power converter circuits, stray capacitance between the connection path and the body of the vehicle easily become larger, and dielectric resistance easily becomes lower. Hence, a great advantage is obtained by diagnosing presence or absence of insulation failure by using the determination value or the information obtained on the basis of the state quantity measured in a state where the power converter circuits are connected.

In the apparatus, the power converter circuits are DC/AC conversion circuits including switching elements selectively opened and closed between each of positive electrode side input terminals and negative electrode side input terminals and terminals of the is in-vehicle auxiliary units, and the outputting unit alternately turns on the switching element connected to the positive electrode side input terminal and the switching element connected to the negative electrode side input terminal.

In the apparatus, when determining the insulation failure, it can be determined with high accuracy that the insulation failure is caused between the body of the vehicle and an electrical path between the DC/AC conversion circuit and the in-vehicle auxiliary unit.

In the apparatus, the diagnosis unit includes a difference signal generating unit (wd) which generates a difference signal expressing a difference between a current flowing through an electrical path between a positive electrode side of the power supply and the positive electrode side input terminal of the power converter circuit, and a current flowing through an electrical path between a negative electrode side of the power supply and the negative electrode side ao input terminal of the power converter circuit. The diagnosis unit diagnoses presence or absence of the insulation failure depending on the difference signal.

When the insulation failure is not caused between the body of the vehicle and the electrical path between the DC/AC conversion circuit and the in-vehicle auxiliary unit, the amounts of currents flowing through the pair of the electrical paths are the same. In contrast, when the insulation failure is caused, the amounts can be considered to be different from each other. Considering this point, the apparatus includes the difference signal generating unit.

In the apparatus, the outputting unit includes a capacitor (44) which is connected between the connection path and the body of the vehicle, and outputs the diagnosis AC signal to the capacitor. The diagnosis unit diagnoses presence or absence of the insulation failure on the basis of the current flowing through the capacitor.

The apparatus further includes a simulating unit including a series connection of an impedance component (60) and an opening and closing unit (62) connected between the connection path and the body of the vehicle. The electrical state quantity is quantified on the basis of a current flowing through the connection path according to the outputted diagnosis AC signal, when the opening and closing unit is in a closed state.

In the apparatus, since insulation failure can be generated on purpose between the connection path and the body of the vehicle by providing the simulating unit, electrical state quantity can easily be measured when insulation failure is caused.

As another aspect of the embodiment, an insulation failure diagnosis apparatus is provided which diagnoses presence or absence of insulation failure between a body of a vehicle and a connection path (LP, Ln, INV1 to INV 4, Lo, 22, 24, 26) to a power supply (10) for a traction unit installed in the vehicle. The apparatus includes; at least one power converter circuit (INV2 to INV 4) which is connected to the power supply and supplies power to at least one in-vehicle auxiliary unit (22, 24, 26); an outputting unit (40, INV2 to INV 4) which outputs a diagnosis AC signal (ds) to the connection path; a diagnosis unit (46) which diagnoses presence or absence of the insulation failure on the basis of a current flowing through the connection path when the diagnosis AC signal is outputted; an adaptation outputting unit (INV2 to INV4) which outputs an AC adapted signal to the connection path; an initial impedance detecting unit (S56) which detects initial impedance between the connection path and the body of the vehicle on the basis of a current flowing through the connection path when the adapted signal is outputted; and a determination value calculating unit (S70) which calculates a determination value for determining the insulation failure by the diagnosis unit on the basis of the initial impedance.

The stray capacitance and dielectric resistance between the connection path and the body of the vehicle depend on the structure of the connection path. Hence, the stray capacitance and dielectric resistance in the state where the power converter circuit is connected to the power supply and those in the state where the power converter circuit is not connected to the power supply are different from each other. Meanwhile, since impedance measured by outputting the is diagnosis AC signal to the connection path is affected by the stray capacitance, the impedance depends on the frequency of the diagnosis AC signal. Hence, to obtain the dielectric resistance, information on stray capacitance is required to be obtained separately.

The apparatus can obtain the information on stray capacitance by the initial impedance detecting unit. Specifically, if the initial impedance is detected in a state where the power converter circuit is connected, the determination value calculating unit can perform an auto-tuning process which automatically calculates a determination value used by the diagnosis unit with reflecting the stray capacitance.

As another aspect of the embodiment, a method of diagnosing insulation failure is provided which diagnoses presence or absence of insulation failure between a body of a vehicle and a connection path (LP, Ln, INV1 to INV 4, Lo) to a power supply (10) for a traction unit installed in the vehicle. The vehicle includes an outputting unit which outputs a diagnosis AC signal (ds) to the connection path, and a diagnosis unit (46) which diagnoses presence or absence of the insulation failure on the basis of a current flowing through the connection path when the diagnosis AC signal is outputted, at least one power converter circuit (INV1 to INV 4), which supplies power to at least one in-vehicle auxiliary unit (22, 24, 26), is connected to the power supply, and the diagnosis unit includes a storage unit (48) which stores a determination value for determining the insulation failure or information for setting the determination value. The method includes: a step of measuring electrical state quantity of the connection path which depends on stray capacitance and dielectric resistance of the connection path obtained when an AC signal is outputted to the connection path in a state where the power converter circuit is connected to the power supply: and a step of storing the determination value or the information depending on the measured electrical state quantity in the storage unit.

The stray capacitance and dielectric resistance between the connection path and the body of the vehicle depend on the structure of the connection path. Hence, the stray capacitance and dielectric resistance in the state where the power converter circuit is connected to the power supply and those in the state where the power converter circuit is not connected to the power supply are different from each other. According to the apparatus, presence or absence of insulation failure can be diagnosed with high accuracy on the basis of the electrical state quantity having high accuracy obtained by measuring electrical state quantity of the connection path in a state where the power converter circuit is connected to the power supply.

In the apparatus, the electrical state quantity is measured in a state where the power converter circuit and the power supply are installed in the vehicle.

The stray capacitance and dielectric resistance depend on the geometric relationship between the connection path and the body of the vehicle. Hence, in a state where the connection path is not arranged in the vehicle, it is difficult to obtain stray capacitance and dielectric resistance with high accuracy. Considering this point, in the apparatus, electrical state quantity of the connection path is measured in a state where the power converter circuit is connected to the power supply in the vehicle.

In the apparatus, the electrical state quantity is quantified on the basis of a current flowing through the connection path according to the outputted diagnosis AC signal.

When outputting the diagnosis AC signal to the connection path, an AC current flowing through the connection path depends on stray capacitance and dielectric resistance between the connection path and the body of the vehicle. Considering this point, in the apparatus, the electrical state quantity which depends on the stray capacitance and the dielectric resistance between the connection path and the body of the vehicle is quantified on the basis of the current.

In the apparatus, the step of measuring is performed within a defined period after all required members are connected to the power supply in the vehicle.

Immediately after all required members are connected to the power supply, it can be considered to be in a normal condition in which there is no insulation failure. Hence, the electrical state quantity accurately reflects stray capacitance and dielectric resistance between the connection path and the body of the vehicle in a normal condition. Considering this point, the apparatus is configured as described above.

In the apparatus, the step of measuring is performed when changing members connected to the power supply in the vehicle.

When the members connected to the power supply are changed, that is, when the structure of the connection path is changed, stray capacitance and dielectric resistance between the connection path and the body of the vehicle can vary. Hence, in the apparatus, by measuring electrical state quantity in such a case, the determination value can be updated.

What is claimed is:

1. An insulation failure diagnosis apparatus which diagnoses presence or absence of insulation failure between a body of a vehicle and a connection path to a power supply for a traction unit installed in the vehicle, comprising:

at least one power converter circuit which is connected to the power supply and supplies power to at least one in-vehicle auxiliary unit;

an outputting unit which outputs a diagnosis AC signal to the connection path; and a diagnosis unit which diagnoses presence or absence of the insulation failure on the basis of a current flowing through the connection path when the diagnosis AC signal is outputted, wherein the diagnosis unit includes a storage unit which stores a determination value for determining the insulation failure or information for setting the determination value, and the determination value or the information is obtained by measuring an electrical state quantity of the connection path which depends on stray capacitance and dielectric resistance of the connection path obtained when an AC signal is outputted to the connection path when the power converter circuit is connected to the power supply.

2. The insulation failure diagnosis apparatus according to claim 1, wherein the electrical state quantity is measured in a state where the power converter circuit and the power supply are installed in the vehicle.

3. The insulation failure diagnosis apparatus according to claim 1, wherein the electrical state quantity is quantified on the basis of a current flowing through the connection path according to the outputted diagnosis AC signal.

4. The insulation failure diagnosis apparatus according to claim 1, wherein the storage unit stores and holds data even in a state where power for performing a process diagnosing presence or absence of the insulation failure is not supplied, and updates the data.

5. The insulation failure diagnosis apparatus according to claim 1, wherein the diagnosis unit determines an abnormal condition in which the insulation failure is caused, a normal condition in which the insulation failure is not caused, and an intermediate condition between the abnormal condition and the normal condition, the apparatus further comprises an indicating unit which indicates the intermediate condition.

6. The insulation failure diagnosis apparatus according to claim 1, wherein the at least one in-vehicle auxiliary unit includes a plurality of in-vehicle auxiliary units, and the at least one power converter circuit includes power converter circuits connected to the plurality of in-vehicle auxiliary units individually.

7. The insulation failure diagnosis apparatus according to claim 6, wherein the power converter circuits are DC/AC conversion circuits including switching elements selectively opened and closed between so each of positive electrode side input terminals and negative electrode side input terminals and terminals of the in-vehicle auxiliary units, and the outputting unit alternately turns on the switching element connected to the positive electrode side input terminal and the switching element connected to the negative electrode side input terminal.

8. The insulation failure diagnosis apparatus according to claim 7, wherein the diagnosis unit includes a difference signal generating unit which generates a difference signal expressing a difference between a current flowing through an electrical path between a positive electrode side of the power supply and the positive electrode side input terminal of the power converter circuit, and a current flowing through an electrical path between a negative electrode side of the power supply and the negative electrode side input terminal of the power converter circuit, and the diagnosis unit diagnoses presence or absence of the insulation failure depending on the difference signal.

9. The insulation failure diagnosis apparatus according to claim 1, wherein the outputting unit includes a capacitor which is connected between the connection path and the body of the vehicle, and outputs the diagnosis AC signal to the capacitor, and the diagnosis unit diagnoses presence or absence of the insulation failure on the basis of the current flowing through the capacitor.

10. The insulation failure diagnosis apparatus according to claim 1, further comprising a simulating unit including a series connection of an impedance component and an opening and closing unit connected between the connection path and the body of the vehicle, wherein the electrical state quantity is quantified on the basis of a current flowing through the connection path according to the outputted diagnosis AC signal, when the opening and closing unit is in a closed state.

11. The insulation failure diagnosis apparatus according to claim 1, further comprising:

an adaptation outputting unit which outputs an AC adapted signal to the connection path;

an initial impedance detecting unit which detects initial impedance between the connection path and the body of the vehicle on the basis of a current flowing through the connection path when the adapted signal is outputted; and a determination value calculating unit which calculates the determination value on the basis of the initial impedance.

12. The insulation failure diagnosis apparatus according to claim 11, further comprising a frequency determining unit which determines a frequency at which the amount of variation of impedance between the connection path and the body of the vehicle with respect to the initial impedance becomes equal to or more than a specified value, which is determined as a frequency of the diagnosis AC signal, when the impedance between the connection path and the body of the vehicle is the maximum value for determining the insulation failure, wherein the adaptation outputting unit sets a plurality of frequencies of the adapted signal, the initial impedance detecting unit detects the initial impedance for each of the frequencies of the adapted signal, and the determination value calculating unit calculates the determination value on the basis of the initial impedance corresponding to the frequency determined by the frequency determining unit.

13. The insulation failure diagnosis apparatus according to claim 12, wherein the at least one in-vehicle auxiliary unit includes a plurality of in-vehicle auxiliary units, the adaptation outputting unit selectively outputs the adapted signal to a portion of the in-vehicle auxiliary units, the initial impedance detecting unit detects the initial impedance for each of the in-vehicle auxiliary units, which are output objects of the adaptation outputting unit, and the frequency determining unit determines a frequency at which the amount of variation becomes equal to more than a specified value for any of the output objects, as a frequency of the diagnosis AC signal.

14. The insulation failure diagnosis apparatus according to claim 12, wherein the power converter circuits are DC/AC conversion circuits including switching elements selectively opened and closed between each of positive electrode side input terminals and negative electrode side input terminals and terminals of the in-vehicle auxiliary units, the outputting unit alternately turns on the switching element connected to the positive electrode side input terminal and the switching element connected to the negative electrode side input terminal, the diagnosis unit includes a difference signal generating unit which generates a difference signal between a current flowing through an electrical path between a positive electrode side of the power supply and the positive electrode side input terminal of the power converter circuit, and a current flowing through an electrical path between a negative electrode side of the power supply and the negative electrode side input terminal of the power converter circuit, and the diagnosis unit diagnoses presence or absence of the insulation failure depending on the difference signal, and the frequency determining unit determines the maximum frequency at which the amount of variation becomes equal to or more than a specified value, as a frequency of the diagnosis AC signal.

15. An insulation failure diagnosis apparatus which diagnoses presence or absence of insulation failure between a body of a vehicle and a connection path to a power supply for a traction unit installed in the vehicle, comprising:

at least one power converter circuit which is connected to the power supply and supplies power to at least one in-vehicle auxiliary unit;

an outputting unit which outputs a diagnosis AC signal to the connection path;

a diagnosis unit which diagnoses presence or absence of the insulation failure on the basis of a current flowing through the connection path when the diagnosis AC signal is outputted;

an adaptation outputting unit which outputs an AC adapted signal to the connection path;

an initial impedance detecting unit which detects initial impedance between the connection path and the body of the vehicle on the basis of a current flowing through the connection path when the adapted signal is outputted; and a determination value calculating unit which calculates a determination value for determining the insulation failure by the diagnosis unit on the basis of the initial impedance.

16. A method of diagnosing insulation failure which diagnoses presence or absence of insulation failure between a body of a vehicle and a connection path to a power supply for a traction unit installed in the vehicle, wherein the vehicle includes an outputting unit which outputs a diagnosis AC signal to the connection path, and a diagnosis unit which diagnoses presence or absence of the insulation failure on the basis of a current flowing through the connection path when the diagnosis AC signal is outputted, at least one power converter circuit, which supplies power to at least one in-vehicle auxiliary unit, is connected to the power supply, and the diagnosis unit includes a storage unit which stores a determination value for determining the insulation failure or information for setting the determination value, the method comprising:

a step of measuring electrical state quantity of the connection path which depends on stray capacitance and dielectric resistance of the connection path obtained when an AC signal is outputted to the connection path in a state where the power converter circuit is connected to the power supply: and a step of storing the determination value or the information depending on the measured electrical state quantity in the storage unit.

17. The method according to claim 16, wherein the electrical state quantity is measured in a state where the power converter circuit and the power supply are installed in the vehicle.

18. The method according to claim 17, wherein the electrical state quantity is quantified on the basis of a current flowing through the connection path according to the outputted diagnosis AC signal.

19. The method according to claim 16, wherein the step of measuring is performed within a defined period after all required members are connected to the power supply in the vehicle.

20. The method according to claim 16, wherein the step of measuring is performed when changing members connected to the power supply in the vehicle.

* * * * *